US00RE35825E

United States Patent [19]

Zagar

[11] E Patent Number: Re. 35,825

[45] Reissued Date of Patent: Jun. 16, 1998

[54] METHOD FOR MAINTAINING OPTIMUM BIASING VOLTAGE AND STANDBY CURRENT LEVELS IN A DRAM ARRAY HAVING REPAIRED ROW-TO-COLUMN SHORTS

[75] Inventor: Paul S. Zagar, Boise, Id.

[73] Assignee: Micron Technology, Inc., Boise, Id.

[21] Appl. No.: 450,765

[22] Filed: May 24, 1995

Related U.S. Patent Documents

Reissue of:

[64] Patent No.: 5,235,550
Issued: Aug. 10, 1993
Appl. No.: 703,436
Filed: May 16, 1991

[51] Int. Cl.[6] ..... G11C 7/00

[52] U.S. Cl. ..... 365/226; 365/189.09

[58] Field of Search ..... 365/189.09, 200, 365/210, 226, 228

[56] References Cited

U.S. PATENT DOCUMENTS

| | | | |
|---|---|---|---|
| 4,404,659 | 9/1983 | Kihara et al. | 365/189.09 X |
| 5,050,127 | 9/1991 | Mitsumoto et al. | 365/189.09 |
| 5,255,223 | 10/1993 | Tanaka et al. | 365/189.09 |

*Primary Examiner*—Steven J. Mottola

*Attorney, Agent, or Firm*—Trask, Britt & Rossa

[57] ABSTRACT

A method for maintaining optimum biasing voltage and standby current levels in a dynamic random access memory array, in which row-to-column shorts have been repaired by redirecting the addresses of shorted rows and columns to spare rows and columns. The method partly consists of placing a current limiting device in series with the bias voltage generator output and the nodes between the equilibration transistors of small groups of digit line pairs. The current limiting devices may be either long-L transistors that are in an always-on state, or they may be merely resistive elements, such as strips of lightly-doped polysilicon. The invention effectively isolates the effect of row-to-column shorts in a portion of a DRAM array from the remainder of the array. All digit line pairs tied to a single current limiting device are replaced as a unit if any one or more of the digit lines among the tied pairs is shorted to a word line.

The method further consists of holding the common node of each P-type sense amplifiers at no more than a threshold voltage above ground potential during digit line equilibration, rather than at half of power supply voltage, in order to eliminate an unwanted current path from an off-chip power supply, through sundry intervening circuitry, to the common node of a P-type sense amplifier, through the transistors of the P-type sense amplifier, to a bitline which is shorted to one of the rowlines, which are normally held at ground potential during the same period.

27 Claims, 9 Drawing Sheets

METHOD FOR MAINTAINING OPTIMUM BIASING VOLTAGE AND STANDBY CURRENT LEVELS IN A DRAM ARRAY HAVING REPAIRED ROW-TO-COLUMN SHORTS

Matter enclosed in heavy brackets [ ] appears in the original patent but forms no part of this reissue specification; matter printed in italics indicates the additions made by reissue.

FIELD OF THE INVENTION

This invention relates to monolithic dynamic random access memory array circuitry and, more particularly, to techniques for repairing row-to-column shorts therein.

BACKGROUND OF THE INVENTION

As monolithic dynamic random access memory (DRAM) arrays increase in density, it becomes more likely, from a statistical standpoint, that one or more shorts will exist between a word line (generally referred to as a "row" within the array) and a digit line (generally referred to as a "column" within the array). For 4-megabit DRAMs, the probability of having one or more row-to-column shorts on a single die ranges between approximately ten and twenty percent, depending on the particular manufacturing process utilized. The principal causes of such shorts are particle contamination and process variability. Even manufacturers having the very cleanest of fabrication facilities and the most carefully controlled of manufacturing processes are not immune from these yield-reducing factors.

As a aid to understanding the complexities associated with row-to-column shorts, a brief explanation of the operation of a DRAM array will be undertaken.

A DRAM array comprises a multiplicity of capacitors, each of which is associated with a single memory cell. Each capacitor stores a single bit of data, which is accessible through an access transistor exclusive to that cell, which, along with other cell access transistors in the same array row, is turned on by activating a single word line. All capacitors within the array have a common node, which is referred to as the cell plate. The voltage of the cell plate is held to approximately $V_{cc}/2$ ($V_{cc}$ being the voltage supplied to the chip). A "1" is stored in the capacitor of a memory cell by charging the capacitor's uncommon node (the storage node plate) to $V_{cc}$ through the access transistor. Likewise, a "0" is stored by discharging the uncommon node to $V_{ss}$ (generally ground potential) through the access transistor. The charge on a cell capacitor is read by first equilibrating the cell plate and all digit lines to $V_{cc}/2$. After the equilibration voltage is disconnected from the digit lines, the cell access transistor is turned on, dumping the charge stored in the cell's capacitor to one of the digit lines. If the storage node plate had been charged to $V_{cc}$, the voltage on that digit line will be increased slightly. Likewise, if the storage node plate had been grounded to $V_{ss}$, the voltage on that digit line will be decreased slightly. An adjacent digit line, to which no charge has been dumped during this read cycle, is used as a reference. The voltage differential between the two digit lines will be within a range of approximately 200 to 200 mV. This differential voltage is then amplified by cross-coupled N-channel and P-channel transistors (sense amplifiers), which respectively pull the digit line having the slightly lower voltage to $V_{ss}$ and the digit line having the slightly higher voltage to $V_{cc}$. Once this has occurred, the voltages on the digit line are passed out of the array to a column decoder and read by n output buffer. FIG. 1 graphically depicts the voltages of two digit line pars (DLP1 and DLP2) as a function of RAS (row address strobe) and word line voltages over the identical time period. The voltage levels on first digit line pair DLP1 are representative of a read operation where a "1" has been stored in the cell being read; those on digit line pair DLP2 are representative of a read operation where a "0" has been stored in the cell being read. Such voltage-time relationships are commonly observed in CMOS DRAM arrays having a folded digit line architecture. If a new value is to be stored in a DRAM cell after the read operation, the polarity of the digit lines may be reversed by write voltages from peripheral drivers passed through the column decoder. Thus, with the cell access transistor turned on, a write voltage on the associated digit line is applied to the cell's storage node plate. When the cell access transistor is turned off (this even corresponds to RAS going high), the digit line voltage (whether $V_{cc}$ or $V_{ss}$) remains on the storage node plate. Since this charge on the storage node capacitor plate is subject to leakage, the cell must be refreshed periodically by performing a "dummy" read operation.

Typical DRAM specifications require that digit lines, once equilibrated to $V_{cc}/2$, maintain that voltage for up to 16 milliseconds for a standard part, and up to 128 milliseconds for a lower power part. During this time, if the digit lines are not tied to a small bias generator, which produces a voltage of approximately $V_{cc}/2$, they will leak to a lower level (if sufficient, time were allowed, they would leak to $V_{ss}$), and the following read operation may consequently fail.

FIG. 2 shows a typical method used to both equilibrate the digit lines and maintain the digit lines at a voltage approximately equal to $V_{cc}/2$. Equilibrate signal EQ will go high after the word line WL is turned off, and will connect each of transistors $Q1_n$ and $Q2_n$ to both a digit line and to a bias voltage generator output DVC. A simply bias voltage generator 21 is shown. A bias voltage generator on the DRAM chip itself provides a regulated voltage approximately equal to $V_{cc}/2$ over a known current range. At this time, all word lines are held at $V_{ss}$. If a row-to-column short 22 exists within the array, the word line WL, which is being held at $V_{ss}$, would be connected through transistors $Q1_1$ and $Q2_1$, to the bias generator output. If the bias generator output is sufficiently large, then the bias generator output voltage will remain at or near $V_{cc}/2$. However, typical DRAM data sheet specifications require the power supply current to be below 1 milliampere while RAS is high. Thus the row-to-column short could cause the part to fail its standby current specification and, thus, be rendered unacceptable. If the bias generator has a limited current output capability, then the row-to column short would cause all digit lines in the part to fall towards $V_{ss}$. FIG. 3 provides a graphic representation of the fall-off in voltage that is characteristic of a badly shorted array after RAS goes high and the word line is brought low. At some point, there will be insufficient voltage on the digit lines for the N-sense amplifiers associated therewith to latch the data thereon, resulting in an invalid read operation and possible loss of data. Referring once again to FIG. 2, if the cell plate CP is common to the bias voltage generator bus 23 (such, an architecture would be represented by switch SW1 closed and switch SW2 opened), instead of having its own $V_{cc}/2$ bias voltage generator 24 (such an architecture would be represented by switch SW1 opened and switch SW2 closed), and if the row-to-column shorts within the array cause the chip to draw more current then the rated output of bias voltage generator, the cell plate CP will be biased at a voltage less than $V_{cc}/2$. The voltage on the cell plate may even fall to $V_{ss}$, such a precipitous drop in cell plate bias voltage may well result in the overstressing of the cell dielectric layer, which is designed to reliably handle a voltage less than $V_{cc}/2$. Thus, given the scenario where the bias voltage drops to $V_{ss}$ after a long RAS high time, the voltage across the capacitor dielectric would be twice the design voltage. Many of the cells within the array may become damaged during subsequent read operations, with their capacitors permanently shorted.

Still referring to FIG. 2, another problem associated with row-to-column shorts is that of what will be herein termed the "sneak" path from the bias voltage generator bus 23 to ground. During the time that RAS is high it is customary to switch the common node 25 of the P-type sense amp (SA1 in this schematic) from a $V_{cc}$ voltage level to the bias voltage generator bus 23, which has a voltage level of $V_{cc}/2$. This is done to prevent current flow through the transistors of each P-type sense amplifier, from either of the associated digit lines, which would tend to pull the common node low and potentially create a voltage imbalance on the digit lines during equilibration. If a row-to-column short exists on at least one of the associated digit lines, and the common node is being held at $V_{cc}/2$ during equilibration, current will flow from the common node 25, through one of the transistors of P-type sense amp SA1, to the shorted digit line, and to the associated digit line through equilibration transistors $Q1_1$ and $Q2_1$. Thus, with common node 25 connected to bias voltage generator bus 23, a row-to-column short will place an unacceptable load on bias voltage generator 23 through this additional path, with the same deleterious effects as described above.

By creating spare rows and spare columns within a DRAM array in combination with address redirection circuitry, it is possible to substitute functional spare rows and columns for those that are shorted--at least to the extent that shorted rows and columns do not exceed the number of spare rows and columns. It is important to realize that the shorted columns are rows are not disconnected from the array circuitry. The are simply no longer addressed by the array's address decode circuitry. Disconnection of shorted rows and columns from the array circuitry is impractical—if not impossible—with presently available technology, due to the small inter-word line and inter-digit line pitch used to fabricate DRAM arrays. Schemes for implementing row and column redundancy in DRAM arrays are well known in the art and will not be discussed in further detail in this document.

In light of the foregoing discussion of DRAM operation, it is clear that repair of row-to-column shorts through redirected addressing will not eliminate the presence of shorts within the array, nor will it eliminate the potential for bias voltage pull down, with the attendant problems of excessive standby current, read/write operations resulting in invalid data, and possible damage to cell capacitors within the array.

Hitachi Corporation of Japan has addressed the problem of row-to-column shorts in its 256 megabit DRAM. The chip's memory array is divided into four quadrants, each of which has 64 normal sur-arrays and 2 spare sub-arrays. Whenever a sub-array has a row-to-column short, it is disconnected from the active circuitry and replaced by a spare sub-array. According to Hitachi, the chip area penalty associated with this sub-array replace scheme is 3.5%. Although such a penalty may not seem to be significant, it should be noted that the profit margin for the current generation of DRAMs is probably less than 3.5% for most manufacturers.

What is needed is a solution to the row-to-column short problem that imposes little or no chip area penalty.

SUMMARY OF THE INVENTION

This invention provides a method for isolating the effect of row-to-column shorts in a portion of a DRAM array from the remainder of the array. The method partly consists of placing a current limiting device in series with the bias voltage generator output and the nodes between the equilibration transistors of a small number of digit line pairs. Although a single current limiting device could conceivably be used for each digit line pair, this is impractical from a cost standpoint, as the high number of current limiting devices required for such an architecture would significantly increase die size. On the other hand, all column pairs isolated from the bias voltage generator bus by a single current limiting device will be shorted to $V_{ss}$ if a row-to-column short exists on any of the digit lines among those column pairs. Hence, the tied column pairs must be replaced as a unit if any one or more of the digit lines among the tied column pairs is shorted to a word line. This constraint places a practical limit on the total number of digit line pairs associated with a single current limiting device. The current limiting devices may be either long-L transistors in a always-on state, or they may be merely resistive elements, such as strips of lightly-doped polysilicon. The method further consists of holding the common node of each P-type sense [amplifiers] *amplifier* at no more *than a threshold voltage above ground potential during digit line* equilibration, rather than at half of power supply voltage as is common practice in the art, in order to eliminate an unwanted current path from an off-chip power supply, through sundry intervening circuitry (which, for certain architectures, might include the bias voltage generator) to the common node of a P-type sense amplifier, through the transistors of the P-type sense amplifier, to a bitline which is shorted to a row-line, which is normally held at ground potential during the same period.

PREFERRED EMBODIMENT OF THE INVENTION

Figure 1:
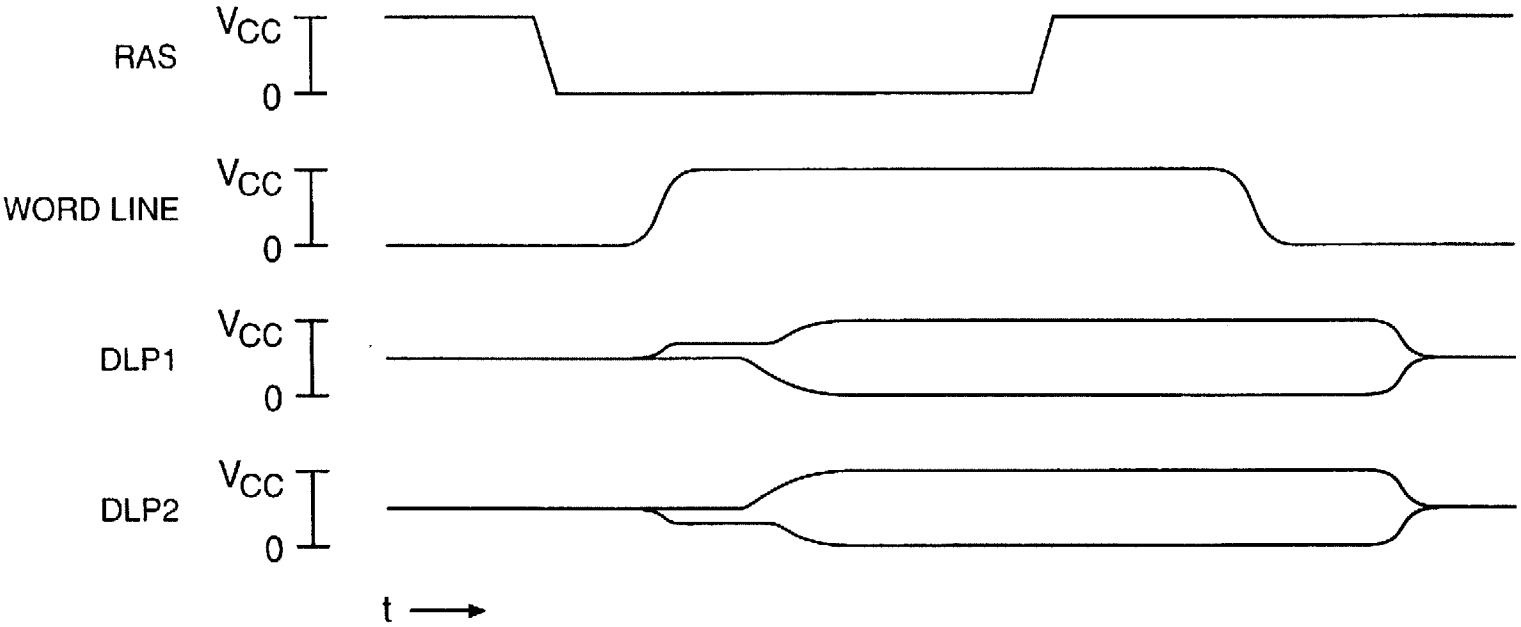
FIG. 1 is a graph of DRAM logic voltage levels during a single read cycle.
Figure 2:
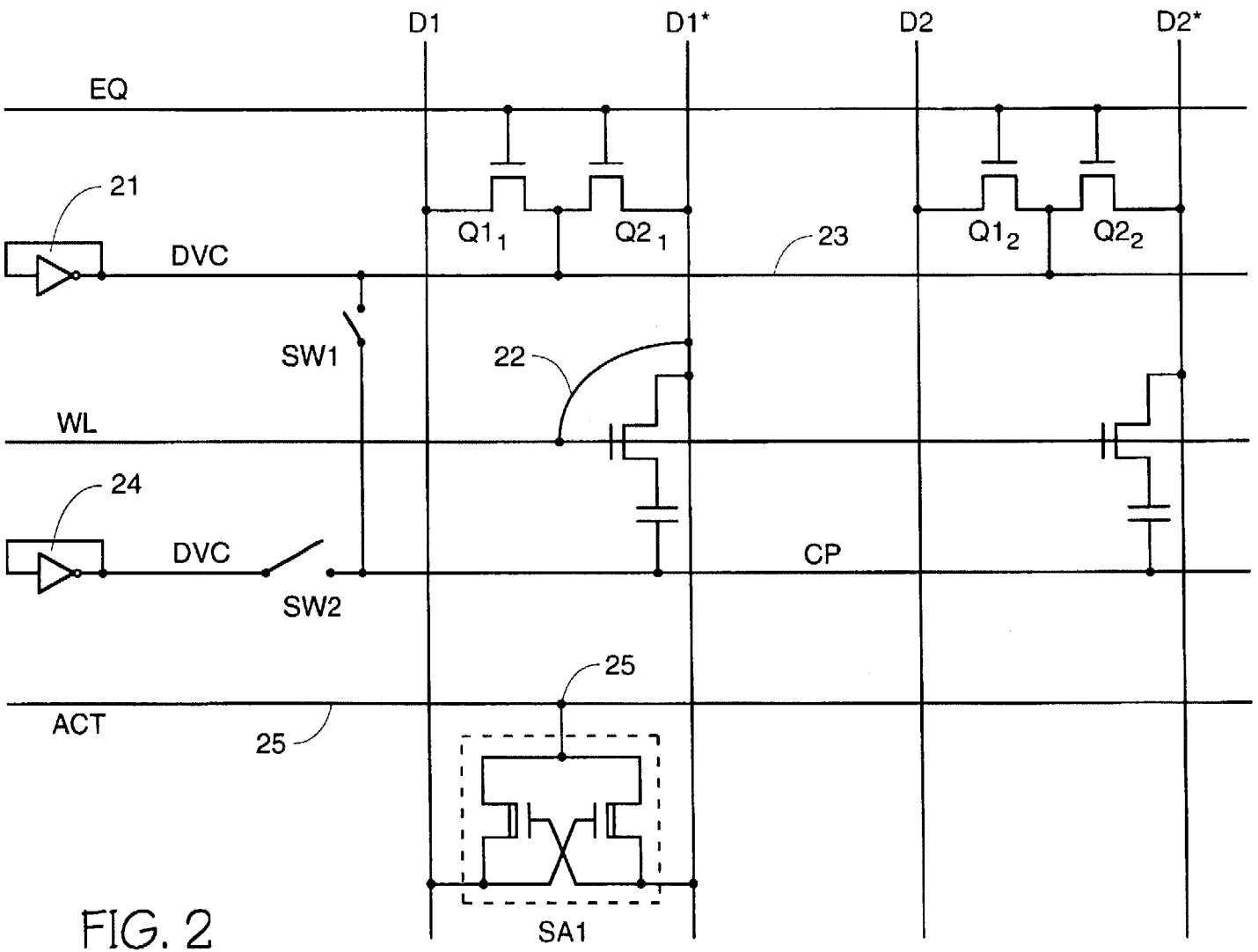
FIG. 2 (PRIOR ART)
FIG. 2 is an abbreviated DRAM array schematic showing two digit line pairs and typical circuitry used to both equilibrate them and maintain them at approximately $V_{cc}/2$, in addition to a P-sense amp which interconnects the pair which has a row-to-column short.
Figure 3:
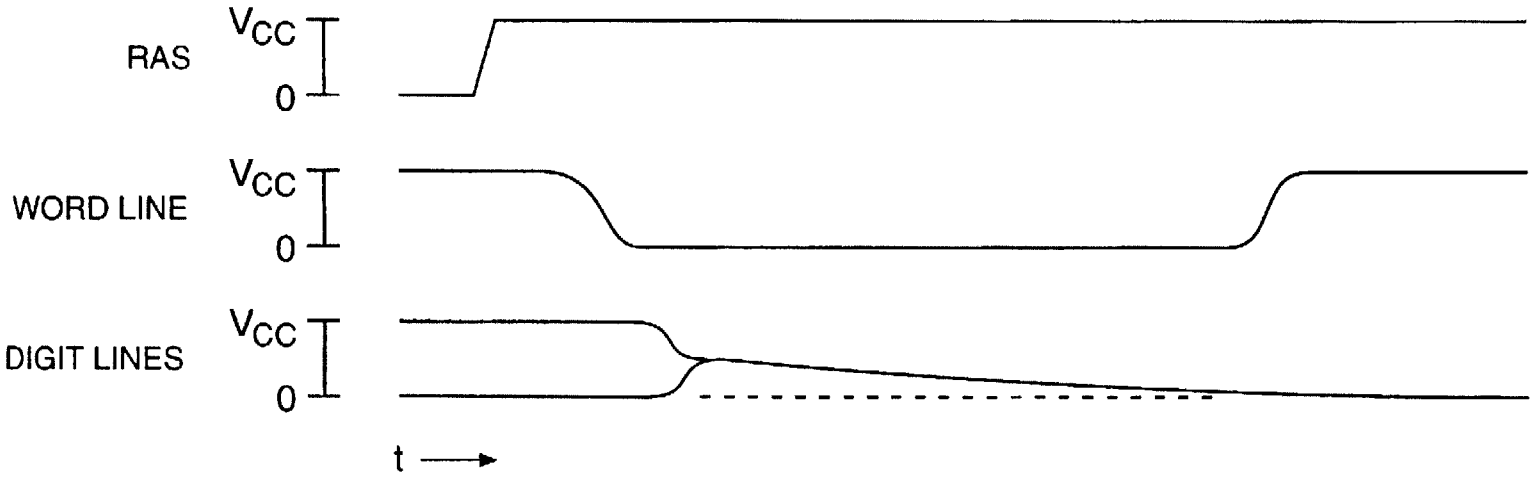
FIG. 3 is a graph of DRAM logic voltages following the transition of RAS from low to high.
Figure 4:
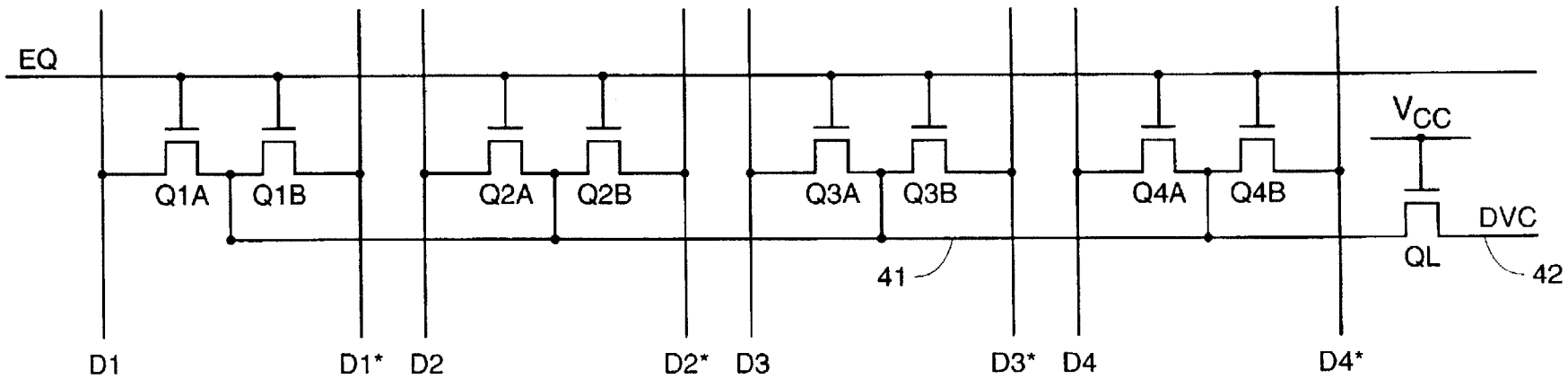
FIG. 4 is a schematic diagram of the invention (i.e., a current limiting device connected in series with the bias voltage generator output and the nodes between the equilibration transistors of a small number of digit line pairs)

Referring now to FIG. 4, a set of four digit line pair (D1–D1*, D2–D2*, D3–D3*, and D4–D4*) is shown with its equilibrate circuitry. Node 41 is a local node with all common nodes of each pair of equilibrate transistors (Q1A–Q1B, Q2A–Q2B, Q3A–Q3B, and Q4A–Q4B). A current limiting device QL is placed in series between the shared node 41 and the $V_{cc}/2$ (also referred to herein as DVC) bias voltage generator bus 41. This arrangement is repeated throughout the array, so that in the event of a row-to-column short within one or more of the digit lines of a particular digit line pair set, only that set will be affected. The current limiting device may be either a long-channel length, narrow-channel width transistor, or it may be merely a resistive element, such at but not limited to, a lightly-doped strip of polysilicon. Although a single current limiting device could conceivably be used for each digit line pair, this is impractical from a cost standpoint, as the high number of current limiting devices required for such an architecture would significantly increase die size. On the other hand, all column pairs isolated from the bias voltage generator bus by a single current limiting device will be shorted to $V_{ss}$ if a row-to-column short exists on any of the digit lines among those column pairs. Hence, the tied column pairs must be replaced as a unit if any one or more of the digit lines among the tied column pairs is shorted to a word line. This constraint places a [practice] *practical* limit on the total number of digit line pairs associated with a single current limiting device.

Figure 5:
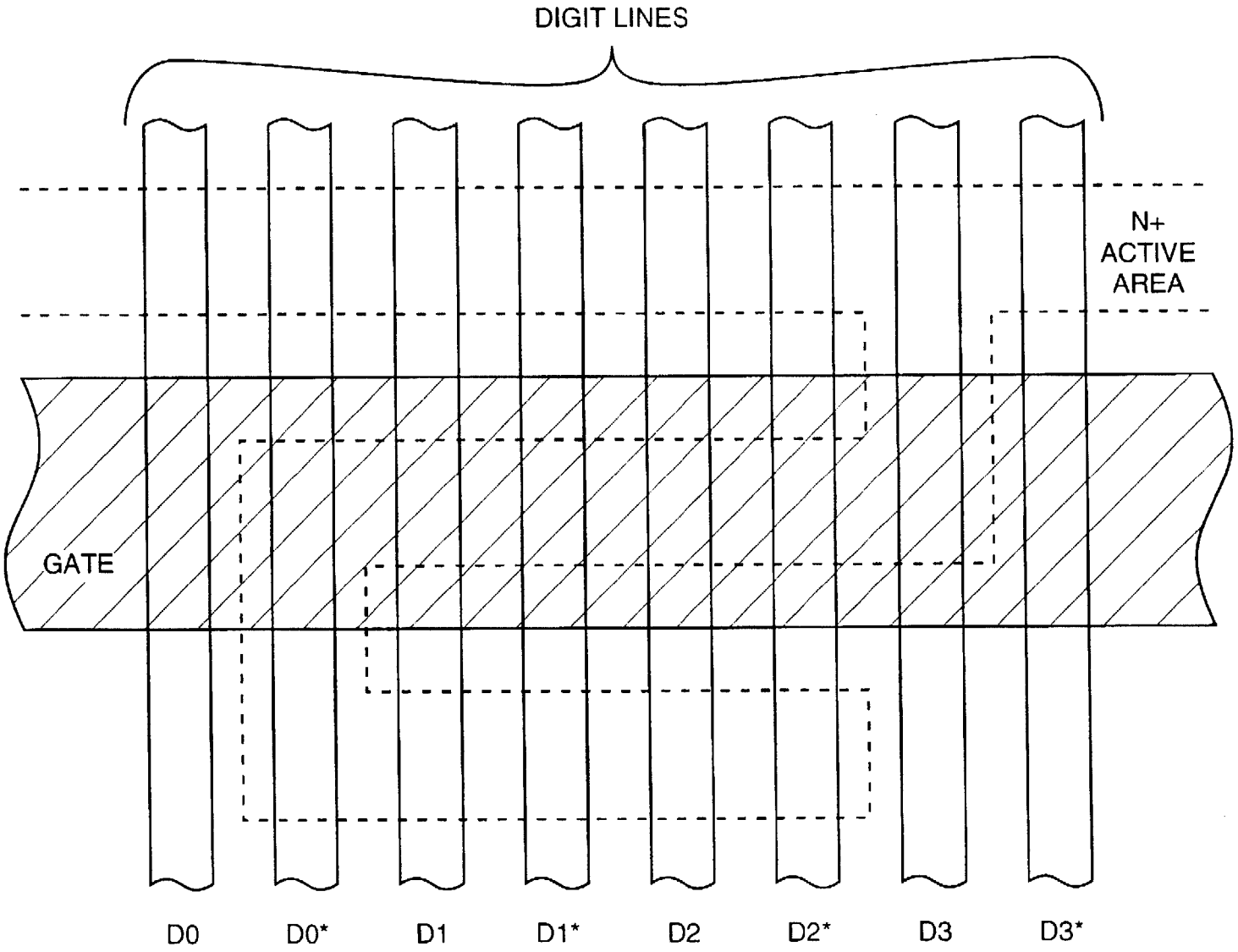
FIG. 5 depicts a method of placing a current limiting device (in this case a long-L transistor) under a group of 4 digit line pairs.

Referring now to FIG. 5, a method is depicted for laying out a current limiting device QL (in this case a long-channel length, narrow-channel width transistor) under a group of four digit line pairs, such that the long square-Z-shaped channel of transistor QL originates from an N+ active area and runs under and, for most of its length, perpendicular to the group of associated digit pairs. This layout approach allows for a current limiting capability of transistor QL to be in the order of 10–20 $\mu$A (for arrays created with 0.8 micron lithography), with minimal impact die size. The gate for the current limiting device is created with the same polysilicon layer used for wordlines, runs beneath the digit lines, and is in an always "on" state.

Figure 6:
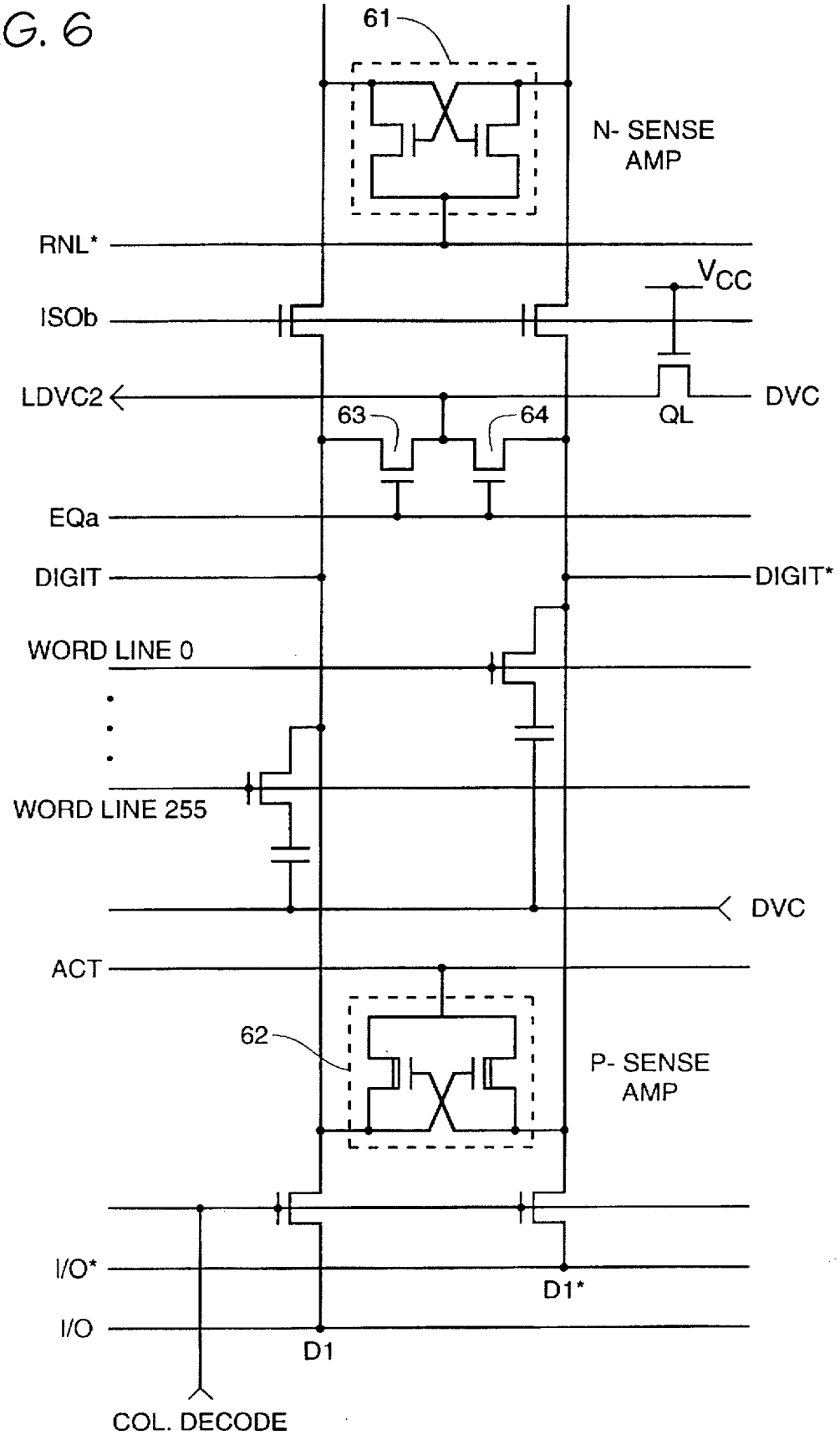
FIG. 6 is a simplified array schematic which incorporates the invention in an architecture wherein neither the N-sense amp, nor the P-sense amp is shared with another digit line pair.

Referring now to FIG. 6, a digit line pair, D1 and D1*, is depicted, as are an N-sense amp 61 and a P-sense amp 62, neither of which is shared with another digit line pair. A current limiting transistor QL is incorporated in the bias voltage circuit of a digit line pair between DVC and local node LDVC. Local node LDVC is routed to the common node of each pair of equilibration transistors associated with all digit line pairs in a set (only transistors 63 and 64 are shown in this example).

Figure 7:
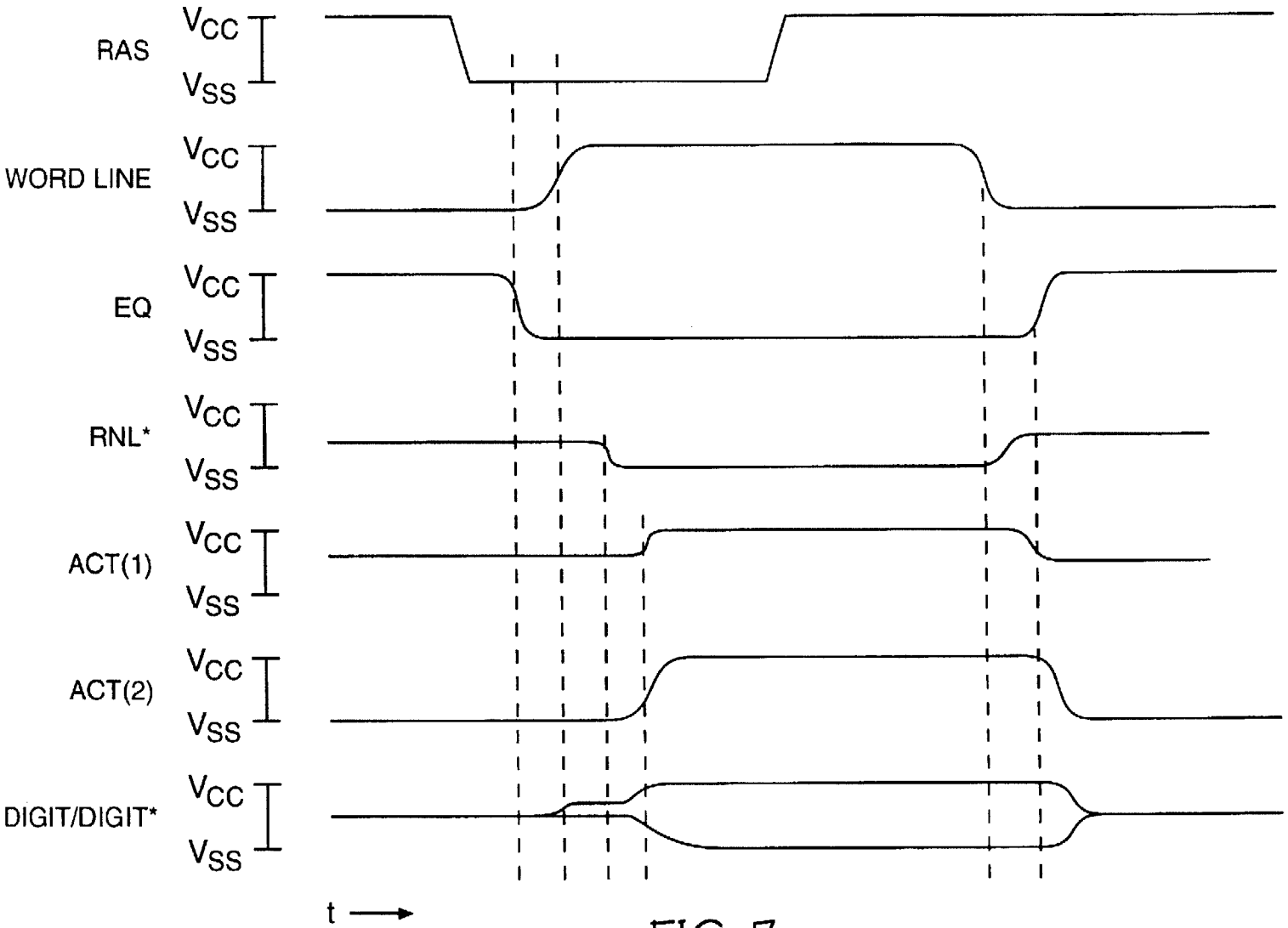
FIG. 7 is a timing diagram for the array of FIG. 6.

Referring now to FIG. 7, a timing diagram for the array of FIG. 6 is depicted. Most noteworthy is the ACT(2) signal, which is brought to ground potential ($V_{ss}$) during bit line equilibration (i.e., when the row address strobe signal (RAS) is high). As long as the ACT(2) signal is no higher thin a threshold voltage above ground potential during this period, there will be no unwanted, power-sinking current path from the off-chip power supply, through sundry intervening circuitry (which, for some architectures, may include the bias voltage generator), to the common node of a P-type sense amplifier, through the transistors of the P-type sense amplifier and, finally, to a bitline which is shorted to one of the rowlines, which are normally held at ground potential during the same period. The ACT(1) signal is representative of prior art sense amp activation signals The dashed lines represent timing sequences.

Figure 8:
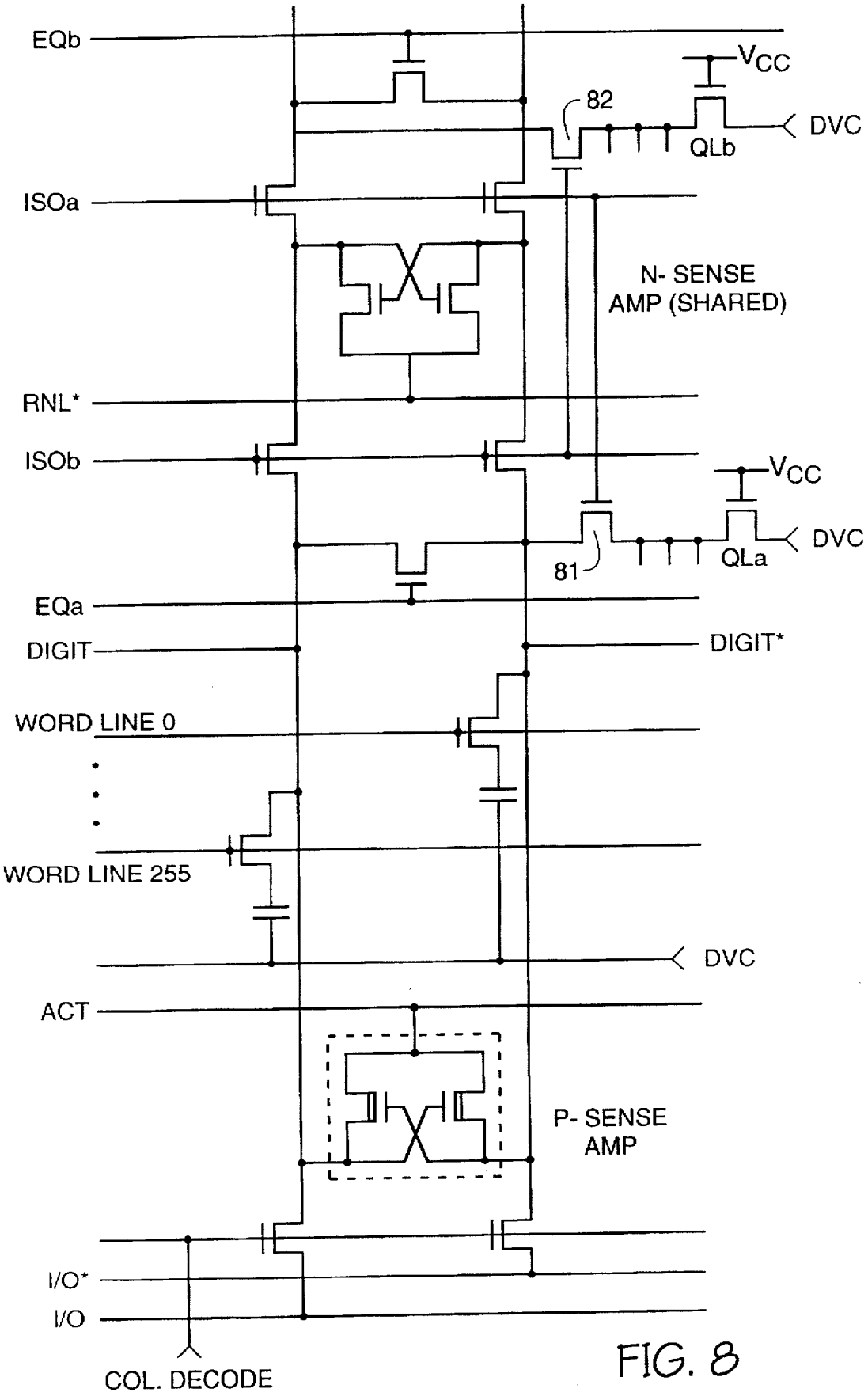
FIG. 8 is a simplified array schematic which incorporates the invention in an architecture wherein the N-sense amp is shared with another digit line pair.

Referring now to FIG. 8, a digit line pair, D1 and D1*, is depicted, as are an N-sense amp 61 and a P-sense amp 62, the former of which is shared with a digit line pair directly above the two that are show. This architecture differs from that depicted in FIG. 6, in that single transistors are used for equilibration of digit lines. Like the architecture of FIG. 6, each current limiting transistor is affiliated with several (in this case 4) digit line pairs. Isolation signal ISOa isolates the upper digit line pair from the N-sense amp when low and connects it to the upper digit line pair when high. Likewise, isolation signal ISOb isolates the lower digit line pair from the N-sense amp when low and connects it to the lower digit line pair when high. In FIG. 6, passing of the current limited bias voltage was passed by the equilibration transistors 63 and 64, whereas in this the array of FIG. 8, the bias voltage is passed through control transistors 81 and 82 which are, in turn, controlled by the isolation signals ISOa and ISOb, respectively.

Figure 9:
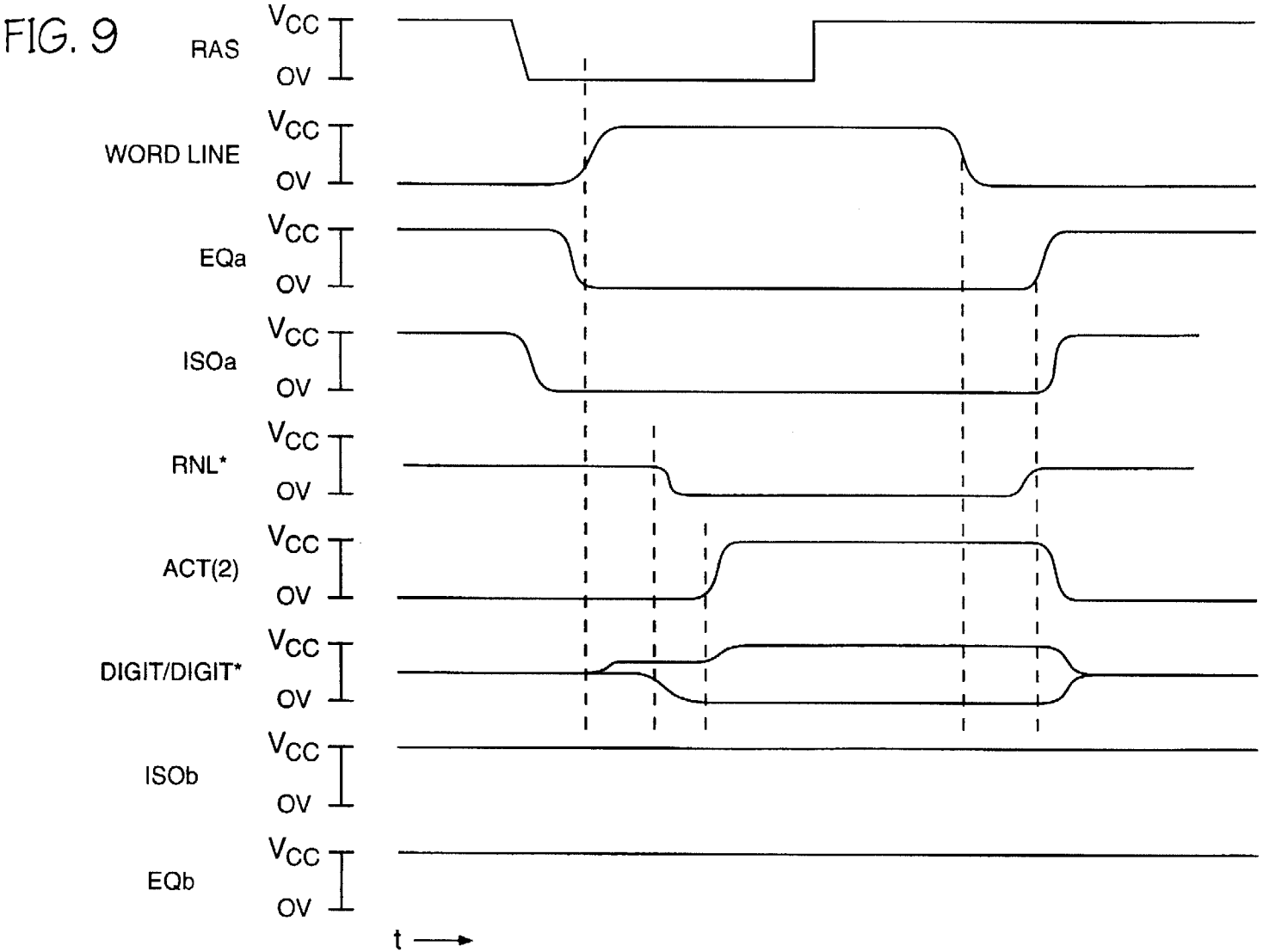
FIG. 9 is a timing diagram for the array of FIG. 8.

Referring now to FIG. 9, a timing diagram for the array of FIG. 8 is depicted. Noteworthy is isolation timing, which as explained above, isolates current limited bias voltage DVC from the digit line pair undergoing a normal read operation. As with the timing diagram of FIG. 7, the ACT(2) signal is brought to ground potential when RAS is high in order to eliminate the unwanted current path from the off-chip power supply, through intervening circuitry, to the common node of a P-type sense amplifier, through the transistors of the P-type sense amplifier and, finally, to a bitline which is shorted to one of the rowlines, which are normally held at ground potential during the same period.

Although only several embodiments of the invention have been described herein, it will be evident to those having ordinary skill in the art that changes and modifications may be made thereto, without departing from the scope and spirit of the invention as claimed.

I claim:

1. A method for maintaining optimum bias voltage and standby current levels in a dynamic random access memory array, said memory array having a plurality of row lines which intersect a plurality of column lines, the intersection of a single row line and a single column line providing a storage location for a single bit of data, said column lines being organized in pairs, each pair being coupled to both a single N-type sense amplifier comprising a pair of cross-coupled N-channel transistors and a single P-type sense amplifier comprising a pair of cross-coupled P-channel transistors having a common-node, said array also having at least one generator for producing a bias voltage which is applied to each digit line pair during digit line equilibration, said array also being repairable with respect to row line to column line shorts by redirecting the addresses of shorted rows and columns to share rows and columns, said method comprising the step [or] *of* organizing all digit line pairs within the array into a multiplicity of digit line pair sets, each set having its own biasing voltage supply path, current through each supply path being limited by at least one current-limiting device so as to protect the generator from deleterious voltage drops caused by a row line to column line short within any set.

2. The method of claim 1, which further comprises the step of holding the common node of each P-type sense amplifier at ground potential during digit line equilibration.

3. The method of claim 1, wherein said current limiting device is a long channel length, narrow channel width transistor that is in an always-on state.

4. The method of claim 2, wherein said current limiting device is a long channel length, narrow channel width transistor that is in an always-on state.

5. The method of claim 2, wherein sad current limiting device is a resistor.

6. The method of claim 2, wherein aid current limiting device is a resistor.

7. The method of claim 1, which further comprises the step of holding the common node of each P-type sense amplifier at a potential no greater than a threshold voltage above ground potential during digit line equilibration.

8. A method for maintaining optimum bias voltage and standby current levels in a dynamic random access memory array, said memory array having a plurality of row lines which intersect a plurality of column lines, the intersection of a single row line and a single column line providing a storage location for a single bit of data, said column lines being organized in pairs, each pair being coupled to both a single N-type sense amplifier comprising a pair of cross coupled N-channel transistors and a single P-type sense amplifier comprising a pair of cross-coupled P-channel transistors having a common node, said array also having at least one generator for producing a bias voltage from a supply voltage provided form an off-chip source, said bias voltage being applied to each digit line pair during digit line equilibration, said array also being repairable with respect to row line to column line shorts by redirecting the addresses of shorted rows and columns to spare rows and columns said method comprising the steps of:

(a) organizing all digit line pairs within the array into a multiplicity of digit line pair sets, each set having its own biasing voltage supply path, current through each supply path being limited by at least one current-limiting device so as to protect the generator from deleterious voltage drops caused by a row line to column line short within any set; and (b) holding the common node of each P-type sense amplifier at a potential no greater than a threshold voltage above ground potential during digit line equilibration, in order to eliminate an unwanted current path from the off-chip source, through the transistors of a P-channel sense amplifier, to a bit-line which is shorted to one of the rowlines that are being held at ground potential during digit line equilibration.

9. The method of claim 8, wherein said current limiting device is a long channel length, narrow channel width transistor that is in an always-on state.

10. The method of claim 8, wherein said current limiting device is a resistor.

11. A method for maintaining optimum bias voltage and standby current levels in a dynamic random access memory array, said memory array having a plurality of row lines which intersect a plurality of column lines, the intersection of a single row line and a single column line providing a storage location for a single bit of data, said column lines being organized in pairs, each pair being coupled to both a single N-type sense amplifier comprising a pair of cross-coupled N-channel transistors and a single P-type sense amplifier comprising a pair of cross-coupled P-channel transistors having a common node, said array also having at least one generator for producing a bias voltage that is applied to each digit line pair during digit line equilibration, said array also being repairable with respect to row line to column line shorts by redirecting the addresses of shorted rows and columns to spare rows and columns, said method comprising the steps of:

(a) organizing all digit line pairs within the array into a multiplicity of digit line pair sets, each set having its own biasing voltage supply path, current through each supply path being limited by at least one current-limiting device so as to protect the generator from deleterious voltage drops caused by a row line to column line short within any set; and (b) holding the common node of each P-type sense amplifier at a potential no greater than a threshold voltage above ground potential during digit line equilibration.

12. The method of claim 11, wherein said current limiting device is a long channel length, narrow channel width transistors that is in an always-on state.

13. The method of claim 11, wherein said current limiting device is a resistor.

*14. A method for preventing excessive standby current levels in a dynamic random access memory, said memory having a plurality of row lines which intersect a plurality of column lines which are functionally organized as column line pairs, the intersection of a row line and a column line providing a storage location for a single bit of data, each row line and each column line pair having a designated address, each column line pair being coupled to both an N-type sense amplifier comprising a pair of cross-coupled N-channel transistors and a P-type sense amplifier comprising a pair of cross-coupled P-channel transistors, said memory having at least one generator for producing a bias voltage which is applied to each digit line pair during digit line equilibration, said memory also being repairable with respect to row line to column line shorts by redirecting the addresses of shorted row lines and shorted column lines to spare row lines and spare column lines, respectively, said method comprising the steps of:*

*(a) functionally organizing all column line pairs within the memory into a multiplicity of column line pair sets, each set comprising at least one column line pair; and*

*(b) providing a separate biasing voltage supply path for each digit line pair set, each path having at least one current-limiting device therein to limit current flow therethrough.*

*15. A dynamic random access memory device comprising:*

*(a) an array of memory cells;*

*(b) an access device for each memory cell, each access device having a control gate;*

*(c) a plurality of digit lines, said digit lines being functionally organized into digit line pairs, and said digit line pairs being functionally organized into digit line pair sets, each set comprising at least one digit line pair;*

*(d) a plurality of word lines which intersect the digit line pairs, each of said word lines being coupled to multiple control gates, each control gate being coupled to a single word line;*

*(e) at least one biasing voltage source;*

*(e) a biasing voltage supply path for each digit line pair set, said biasing voltage supply path coupling each digit line within its respective set to the biasing voltage source during periods of digit line equilibration; and*

*(f) at least one current-limiting device within each biasing voltage supply path.*

*16. The array of claim 15, wherein the each access device is an insulated-gate field-effect transistor and the array further comprises:*

*an N-channel sense amplifier and a P-channel sense amplifier coupled to each digit line pair, each of said sense amplifiers being constructed from a pair of series-coupled field-effect transistors, with the transistors of each transistor pair sharing a common node.*

*17. The array of claim 16, wherein the common node associated with the transistor pair having a channel type opposite that of the cell access devices is maintained at less*

*than a threshold voltage from the potential at which the word lines are maintained during digit line equilibration.*

*18. The array of claim 15, wherein said current-limiting device is a resistor.*

*19. The array of claim 15, wherein said current-limiting device is a transistor.*

*20. The array of claim 19, wherein said transistor is in an always-on state.*

*21. The array of claim 19, wherein said transistor is a field effect transistor having a channel, the length of which is more than thrice the width thereof.*

*22. A memory device comprising:*

*(a) a plurality of digit lines, said digit lines being functionally organized into digit line sets, each set comprising multiple digit lines;*

*(b) at least one biasing voltage source;*

*(c) a separate biasing voltage supply path for each digit line set which selectively couples said biasing voltage source to the digit lines of its respective set; and*

*(d) at least one current-limiting device within each biasing voltage supply path.*

*23. A dynamic random access memory comprising:*

*(a) a plurality of memory cells, each memory cell having a field-effect transistor as an access device, each of said access devices having a control gate;*

*(b) a plurality of digit line pairs, said digit line pairs being functionally organized into digit line pair sets, each set comprising at least one digit line pair;*

*(c) a plurality of word lines which intersect said digit line pairs, the intersection of each word line and each digit line pair corresponding to a single memory cell location within the memory, each word line being coupled to multiple control gates, each control rate being coupled to a single word line;*

*(d) an N-channel sense amplifier and a P-channel sense amplifier coupled to each digit line pair, each of said sense amplifiers being constructed from a pair of series-coupled field-effect transistors, with each pair of transistors sharing a common node;*

*(e) at least biasing voltage source;*

*(f) a biasing voltage supply path for each digit line set, said path coupling said biasing voltage source to the digit lines of its respective set during periods of digit line equilibration; and*

*(g) at least one current-limiting device within each biasing voltage supply path.*

*24. The memory array of claim 23, wherein the common node associated with the transistor pair having a channel type opposite that of the cell access transistors is maintained at less than a threshold voltage from the potential at which the word lines are maintained during digit line equilibration.*

*25. A memory device comprising:*

*a pair of digit lines;*

*a pair of equilibration devices coupled together in series to said digit lines, said equilibration devices coupled together at a common node and responsive to an equilibration signal to couple the common node to said digit lines;*

*a bias voltage generator; and*

*a current limiting device coupled in series to the common node and to an output of said bias voltage generator.*

*26. A memory device, comprising:*

*a first digit line;*

*a second digit line;*

*an equilibration device coupled to said first digit line and to said second digit line responsive to an equilibration signal to couple said first digit line to said second digit line;*

*a bias voltage generator;*

*a current limiting device coupled to said bias voltage generator; and*

*an isolation device coupled in series with said first digit line and said current limiting device.*

*27. A device, comprising:*

*a plurality of digit line pairs;*

*a current limiting device;*

*a plurality of equilibration devices, at least one equilibration device coupled between the digit lines of each digit line pair; and*

*a bias voltage generator coupled to said plurality of equilibration devices through said current limiting device.*

* * * * *